United States Patent
Woodhull et al.

(10) Patent No.: US 9,326,391 B2
(45) Date of Patent: Apr. 26, 2016

(54) COMBINED AUDIO JACK AND MOBILE ELECTRONIC DEVICE ENCLOSURE

(71) Applicant: APPLE INC., Cupertino, CA (US)

(72) Inventors: Charles B. Woodhull, San Francisco, CA (US); Jason S. Sloey, Cedar Park, TX (US)

(73) Assignee: APPLE INC., Cupertino, CA (US)

( * ) Notice: Subject to any disclaimer, the term of this patent is extended or adjusted under 35 U.S.C. 154(b) by 122 days.

(21) Appl. No.: 13/969,378

(22) Filed: Aug. 16, 2013

(65) Prior Publication Data

US 2014/0060917 A1    Mar. 6, 2014

Related U.S. Application Data

(60) Provisional application No. 61/696,111, filed on Aug. 31, 2012.

(51) Int. Cl.
*H05K 5/00* (2006.01)
*H04M 1/02* (2006.01)

(52) U.S. Cl.
CPC ........... *H05K 5/0004* (2013.01); *H04M 1/0274* (2013.01)

(58) Field of Classification Search
USPC ........................ 174/520; 455/575.8
See application file for complete search history.

(56) References Cited

U.S. PATENT DOCUMENTS

| | | | | |
|---|---|---|---|---|
| 4,015,070 A | * | 3/1977 | Theurer | 174/535 |
| 5,683,005 A | * | 11/1997 | Mordick | 220/3.7 |
| 7,149,089 B2 | * | 12/2006 | Blasko et al. | 361/752 |
| 8,476,540 B2 | * | 7/2013 | Dahl et al. | 174/520 |
| 8,772,650 B2 | * | 7/2014 | Merz et al. | 174/520 |
| 2010/0216526 A1 | | 8/2010 | Chen et al. | |
| 2011/0068665 A1 | | 3/2011 | Cao | |

FOREIGN PATENT DOCUMENTS

EP    1133222 A1    9/2001

OTHER PUBLICATIONS

U.S. Appl. No. 14/473,781, filed Aug. 29, 2014, entitled, "Audio Jack Connector Integrated into Enclosure," (unpublished).
International Search Report and Written Opinion for International PCT Application No. PCT/US2013/055716, mailed Nov. 4, 2013, 10 pages.

* cited by examiner

*Primary Examiner* — Dhirubhai R Patel
(74) *Attorney, Agent, or Firm* — Kilpatrick Townsend & Stockton, LLP

(57) ABSTRACT

Enclosures for electronic devices are provided. These enclosures can be integrally formed with a full or partial receptacle connector shell for receiving electrical connectors such as audio connectors or plugs. For example, an enclosure made from a polymer can be integrally formed with an audio jack shell in an injection molding process. As another example, an enclosure can be integrally formed with one or more full or partial walls of an audio jack shell to form a single piece of polymer or metal and the remaining walls of the audio jack shell can be overmolded or assembled to the polymer or metal walls of the audio jack and proximate portions of the enclosure to form a full or complete audio jack shell.

14 Claims, 8 Drawing Sheets

COMBINED AUDIO JACK AND MOBILE ELECTRONIC DEVICE ENCLOSURE

CROSS-REFERENCES TO RELATED APPLICATIONS

This application is a non-provisional, claiming benefit under 35 U.S.C. §119(e), of U.S. Patent Application No. 61/696,111 filed Aug. 31, 2012 for "Combined Audio Jack and Mobile Electronic Device Enclosure." The entire disclosure of the above mentioned application is incorporated by reference for all purposes.

BACKGROUND OF THE INVENTION

The present invention relates generally to enclosures for electronic devices, and in particular enclosures including electrical connectors such as a receptacle connector for receiving an audio connector or plug.

Many electronic devices include electrical connectors that receive data and, in some cases, receive and provide power and data. These electrical connectors are typically receptacle connectors and are designed to receive a male plug connector. The male plug connector may be on the end of a cable. The plug connector may plug into the receptacle connector, thereby forming one or more conductive paths for signals and/or power.

Receptacle connectors often have a shell that surrounds and provides mechanical support for contacts of the receptacle connector. Receptacle connector shells are typically made from plastics. The contacts may be arranged to mate with corresponding contacts on the plug connector, e.g., an audio plug, to form portions of electrical paths between devices.

These receptacle connectors, e.g., audio jacks, are often manufactured separately from the enclosure and sometimes by a manufacturer different than the enclosure manufacturer. These off-the-shelf receptacle connectors may be attached with bolts or otherwise fixed to enclosures of electronic devices. Some receptacle connectors are customized for use within a specific electronic device or a group of electronic devices. These custom receptacle connectors may also be manufactured separately from the enclosure and inserted into the enclosure during the assembly process of the electronic device.

As electronic devices continue to become smaller, these enclosures have increasingly limited internal space while still including a large number of internal components. Limited space within the enclosures of devices creates a number of challenges. For example, the limited internal space of these enclosures drives the demand for smaller internal components such as smaller receptacle connector shells. However, smaller receptacle connector shells that are compatible with industry standard connectors such as the 3.5 mm audio plug may not be available. Proprietary plug connectors or 2.5 mm audio plugs that include smaller receptacle connectors shells could be implemented in some situations but that would require consumers to purchase new devices and/or related accessories.

Many devices suffer from all or some of these deficiencies or from similar deficiencies. Accordingly, it is desirable to provide enclosures having smaller internal components such as audio jacks.

BRIEF SUMMARY OF THE INVENTION

The present invention relates generally to enclosures for electronic devices, and in particular enclosures integrally formed with a full or partial receptacle connector shell for receiving electrical connectors such as audio connectors or plugs. For example, an enclosure made from a polymer may be integrally formed with an audio jack shell in an injection molding process. As another example, an enclosure may be integrally formed with one or more full or partial walls of an audio jack shell to form a single piece of polymer or metal and the remaining walls of the audio jack shell may be overmolded to the polymer or metal walls of the audio jack and proximate portions of the enclosure to form a full or complete audio jack shell. Accordingly, a receptacle connector shell may be integrated with an enclosure of an electronic device to reduce the overall space requirements of the receptacle connector within the enclosure and/or potentially reduce the size of the enclosure required to contain the receptacle connector. This enclosure design may also be desirable because it may provide sealing between the receptacle connector shell and the enclosure to protect against liquid ingress, a structurally robust receptacle connector shell, and reduced material requirements and manual assembly time.

According to one embodiment, an electronic device enclosure is provided. The electronic device enclosure can include a back portion that includes front and back surfaces, left and right opposing walls, and top and bottom opposing walls. The bottom wall can include an opening that communicates with a cavity. The electronic device enclosure can also include inner surfaces of a connector shell that define the cavity. The connector shell can be integrally formed with the back portion and the bottom wall and can be defined at least in part by: a top connector shell portion extending from the bottom wall towards the top wall, first and second opposing sidewalls extending from the bottom wall towards the top wall, and a third sidewall opposite the bottom wall extending between the first and second sidewalls. The first, second and third sidewalls can also extend from the top connector shell portion to the back portion. The enclosure can form a unified body that is formed from a single piece of material.

According to another embodiment, an electronic device enclosure is provided. The electronic device enclosure can include a back portion that includes front and back surfaces, left and right opposing walls, and top and bottom opposing walls. The bottom wall can include including an opening. The front surface of the back portion can include first and second ridges disposed adjacent to and on opposite sides of the opening and extending towards the top wall. The first and second ridges can include a depth. The enclosure can form a unified body that is formed from a single piece of material.

According to yet another embodiment, an electronic device enclosure is provided. The electronic device enclosure can include left and right opposing walls and top and bottom opposing walls extending between the left and right opposing walls. The bottom wall can include an opening. The electronic device enclosure can also include at least a portion of a connector shell integrally formed with the bottom wall. The enclosure can form a unified body that is formed from a single piece of material.

Although aspects of the invention are described in relation to enclosures integrally formed with reduced size audio jacks, it is appreciated that these features, aspects and methods can be used in a variety of different environments, regardless of receptacle connector size or type.

The enclosures described herein may be integrally formed with a variety of different electrical connector shells, which may use a variety of different connector technologies. The invention may apply to many commonly used connectors, including standard Universal Serial Bus (USB), a High-Definition Multimedia Interface (HDMI), Digital Visual Interface (DVI), DisplayPort, Thunderbolt, FireWire, power, Ethernet connectors, as well as many of the proprietary connectors, e.g., Apple's proprietary 30-pin connector, used with common electronics. The invention may also apply to internal connectors or other connections between components within the enclosure of an electronic device. Additionally, the invention may apply to devices such as tablets, laptops, netbooks, desktops, and all-in-one computers; cell, smart, and media phones; storage devices, portable media players, navigation systems, monitors, and others.

To better understand the nature and advantages of the present invention, reference should be made to the following description and the accompanying figures. It is to be understood, however, that each of the figures is provided for the purpose of illustration only and is not intended as a definition of the limits of the scope of the present invention. Also, as a general rule, and unless it is evident to the contrary from the description, where elements in different figures use identical reference numbers, the elements are generally either identical or at least similar in function or purpose.

DETAILED DESCRIPTION OF THE INVENTION

The present invention will now be described in detail with reference to certain embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known details have not been described in detail in order not to unnecessarily obscure the present invention.

Before describing the present invention, electronic devices in which the invention may be implemented and audio connectors or plugs corresponding to receptacle connectors of the invention are first described in the following two sections.

I. Electronic Devices in Which the Invention may be Implemented

Figure 1:
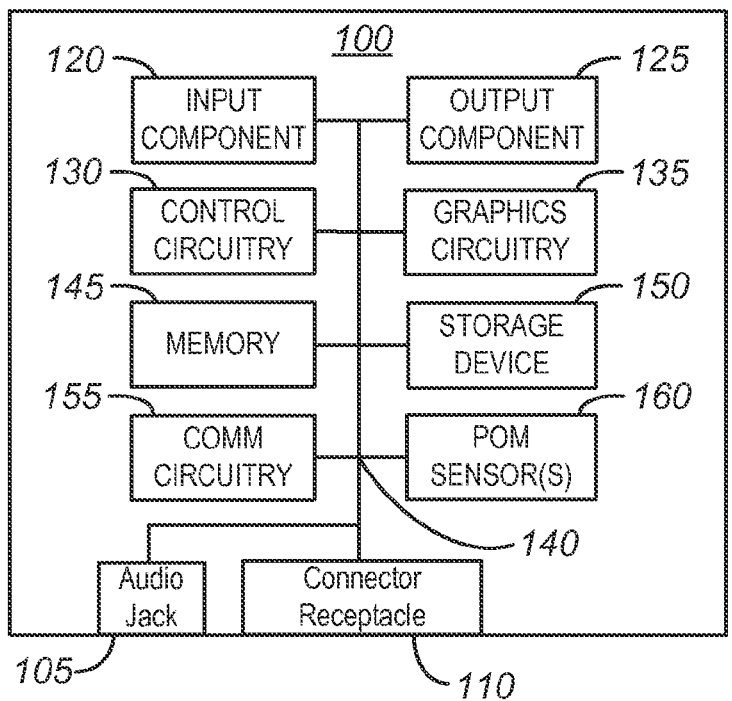
FIG. 1 illustrates a simplified illustrative block diagram representing an electronic media device that includes an audio receptacle connector according to embodiments of the present invention.

FIG. 1 is a simplified illustrative block diagram representing an electronic media device 100 that includes an audio receptacle connector 105 according to embodiments of the present invention. Electronic media device 100 may also include, among other components, connector receptacle 110, one or more user input components 120, one or more output components 125, control circuitry 130, graphics circuitry 135, a bus 140, a memory 145, a storage device 150, communications circuitry 155 and POM (position, orientation or movement sensor) sensors 160. Control circuitry 130 may communicate with the other components of electronic media device 100 (e.g., via bus 140) to control the operation of electronic media device 100. In some embodiments, control circuitry 130 may execute instructions stored in a memory 145. Control circuitry 130 may also be operative to control the performance of electronic media device 100. Control circuitry 130 may include, for example, a processor, a microcontroller and a bus (e.g., for sending instructions to the other components of electronic media device 100). In some embodiments, control circuitry 130 may also drive the display and process inputs received from input component 120.

Memory 145 may include one or more different types of memory that may be used to perform device functions. For example, memory 145 may include cache, flash memory, ROM, RAM and hybrid types of memory. Memory 145 may also store firmware for the device and its applications (e.g., operating system, user interface functions and processor functions). Storage device 150 may include one or more suitable storage mediums or mechanisms, such as a magnetic hard drive, flash drive, tape drive, optical drive, permanent memory (such as ROM), semi-permanent memory (such as RAM) or cache. Storage device 150 may be used for storing media (e.g., audio and video files), text, pictures, graphics, advertising or any suitable user-specific or global information that may be used by electronic media device 100. Storage device 150 may also store programs or applications that may run on control circuitry 130, may maintain files formatted to be read and edited by one or more of the applications and may store any additional files that may aid the operation of one or more applications (e.g., files with metadata). It should be understood that any of the information stored on storage device 150 may instead be stored in memory 145.

Electronic media device 100 may also include input component 120 and output component 125 for providing a user with the ability to interact with electronic media device 100. For example, input component 120 and output component 125 may provide an interface for a user to interact with an application running on control circuitry 130. Input component 120 may take a variety of forms, such as a keyboard/keypad, trackpad, mouse, click wheel, button, stylus or touch screen. Input component 120 may also include one or more devices for user authentication (e.g., a smart card reader, a fingerprint reader or an iris scanner) as well as an audio input device (e.g., a microphone) or a video input device (e.g., a camera or a web cam) for recording video or still frames. Output component 125 may include any suitable display, such as a liquid crystal display (LCD) or a touch screen display, a projection device, a speaker or any other suitable system for presenting information or media to a user. Output component 125 may be controlled by graphics circuitry 135. Graphics circuitry 135 may include a video card, such as a video card with 2D, 3D or vector graphics capabilities. In some embodiments, output component 125 may also include an audio component that is remotely coupled to electronic media device 100. For example, output component 125 may include a headset, headphones or ear buds that may be coupled to electronic media device 100 with a wire or wirelessly (e.g., Bluetooth headphones or a Bluetooth headset).

Electronic media device 100 may have one or more applications (e.g., software applications) stored on storage device 150 or in memory 145. Control circuitry 130 may be configured to execute instructions of the applications from memory 145. For example, control circuitry 130 may be configured to execute a media player application that causes full-motion video or audio to be presented or displayed on output component 125. Other applications resident on electronic media device 100 may include, for example, a telephony application, a GPS navigator application, a web browser application and a calendar or organizer application. Electronic media device 100 may also execute any suitable operating system, such as Mac OS, Apple iOS, Linux or Windows and can include a set of applications stored on storage device 150 or memory 145, which applications may be compatible with the operating system running on the device.

In some embodiments, electronic media device 100 may also include communications circuitry 155 to connect to one or more communications networks. Communications circuitry 155 may be any suitable communications circuitry operative to connect to a communications network and to transmit communications (e.g., voice or data) from electronic media device 100 to other devices within the communications network. Communications circuitry 155 may be operative to interface with the communications network using any suitable communications protocol such as, for example, Wi-Fi (e.g., a 802.11 protocol), Bluetooth, high frequency systems (e.g., 900 MHz, 2.4 GHz and 5.6 GHz communication systems), infrared, GSM, GSM plus EDGE, CDMA, quadband and other cellular protocols, VOIP or any other suitable protocol.

In some embodiments, communications circuitry 155 may be operative to create a communications network using any suitable communications protocol. Communications circuitry 155 may create a short-range communications network using a short-range communications protocol to connect to other devices. For example, communications circuitry 155 may be operative to create a local communications network using the Bluetooth protocol to couple with a Bluetooth headset (or any other Bluetooth device). Communications circuitry 155 may also include a wired or wireless network interface card (NIC) configured to connect to the Internet or any other public or private network. For example, electronic media device 100 may be configured to connect to the Internet via a wireless network, such as a packet radio network, an RF network, a cellular network or any other suitable type of network. Communication circuitry 145 may be used to initiate and conduct communications with other communications devices or media devices within a communications network.

Electronic media device 100 may also include any other component suitable for performing a communications operation. For example, electronic media device 100 may include a power supply, an antenna, ports or interfaces for coupling to a host device, a secondary input mechanism (e.g., an ON/OFF switch) or any other suitable component.

Electronic media device 100 may also include POM sensors 160. POM sensors 160 may be used to determine the approximate geographical or physical location of electronic media device 100. As described in more detail below, the location of electronic media device 100 may be derived from any suitable trilateration or triangulation technique, in which case POM sensors 160 may include an RF triangulation detector or sensor or any other location circuitry configured to determine the location of electronic media device 100.

POM sensors 160 may also include one or more sensors or circuitry for detecting the position orientation or movement of electronic media device 100. Such sensors and circuitry may include, for example, single-axis or multi-axis accelerometers, angular rate or inertial sensors (e.g., optical gyroscopes, vibrating gyroscopes, gas rate gyroscopes or ring gyroscopes), magnetometers (e.g., scalar or vector magnetometers), ambient light sensors, proximity sensors, motion sensors (e.g., a passive infrared (PIR) sensor, active ultrasonic sensor or active microwave sensor) and linear velocity sensors. For example, control circuitry 130 may be configured to read data from one or more of POM sensors 160 in order to determine the location orientation or velocity of electronic media device 100. One or more of POM sensors 160 may be positioned near output component 125 (e.g., above, below or on either side of the display screen of electronic media device 100).

Figure 2:
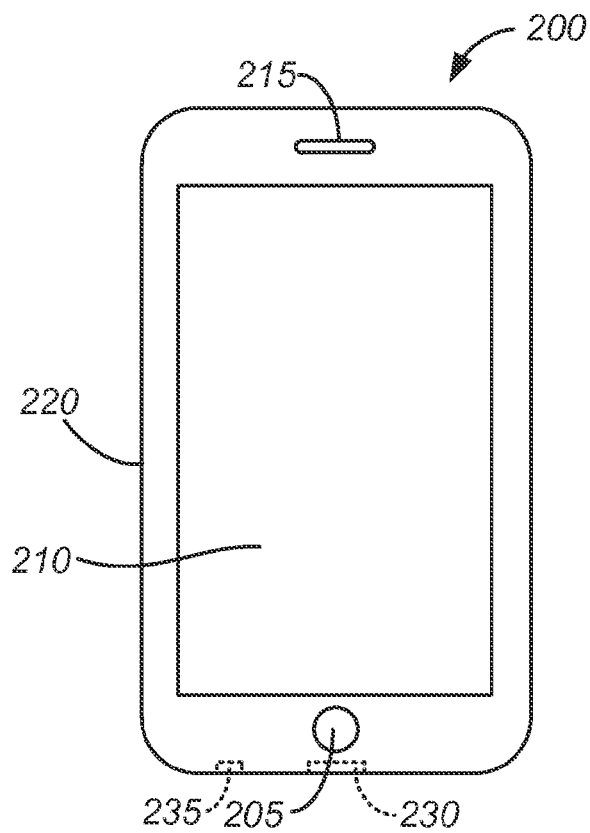
FIG. 2 illustrates a rendering of one particular electronic media device.

FIG. 2 depicts an illustrative rendering of one particular electronic media device 200. Device 200 includes a multipurpose button 205 as an input component, a touch screen display 210 as both an input and output component, and a speaker 215 as an output component, all of which are housed within a device housing 220. Device 200 also includes a primary receptacle connector 230 and an audio receptacle connector 235 or audio jack within device housing 220. Each of the receptacle connectors 230 and 235 can be positioned within housing 220 such that an opening of the receptacle connectors 230, 235 into which a corresponding plug connector is inserted is located at an exterior surface of the device housing. In some embodiments, these openings may be located at an exterior side surface of device 200. For simplicity, various internal components, such as the control circuitry, graphics circuitry, bus, memory, storage device and other components are not shown in FIG. 2.

Electronic media device 200 may be a portable computing device; a tablet; a smart or media phone; or a portable media player. However, as discussed earlier, embodiments of the present invention may be implemented in laptops, desktops; all-in-one computers; cell phones, storage devices; navigation systems; monitors or other electronic devices.

Embodiments of the invention disclosed herein pertain to an enclosure portion (not shown in FIG. 2) of housing 220 that is integrally formed with audio receptacle connector 235, but in other embodiments the enclosure may be integrally formed with receptacle connector 230. Additionally, in some embodiments, housing 220 may only include a single receptacle connector 230 (as opposed to the two receptacle connectors shown in FIG. 2) that is used to connect to other electronic devices. In these embodiments, the enclosure may be integrally formed with receptacle connector 230.

II. Audio Connectors or Plugs Corresponding to Receptacle Connectors of the Invention Embodiments of the present invention may include a receptacle connector for receiving an audio connector or plug, e.g., a standard audio connector or plug. Standard audio plugs are available in three sizes according to the outside diameter of the plug: a 6.35 mm (¼") plug, a 3.5 mm (⅛") miniature plug and a 2.5 mm (³⁄₃₂") subminiature plug. The plugs include multiple conductive regions that extend along the length of the connectors in distinct portions of the plug such as the tip, sleeve and one or more middle portions between the tip and sleeve resulting in the connectors often being referred to as TRS (tip, ring and sleeve) connectors.

Figure 3A:
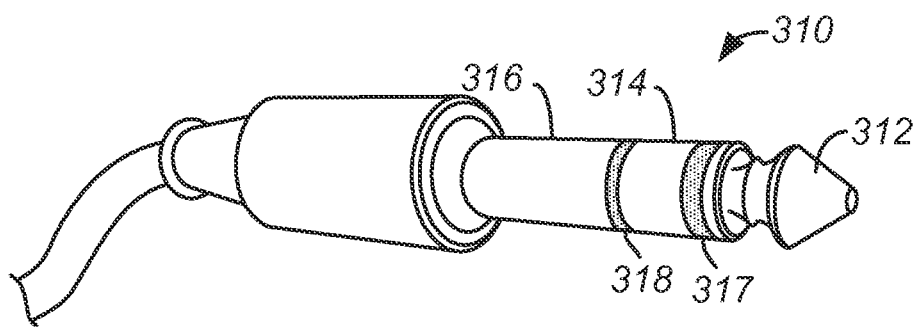
FIGS. 3A-B illustrate examples of audio plugs having three and four conductive portions, respectfully.
Figure 3B:
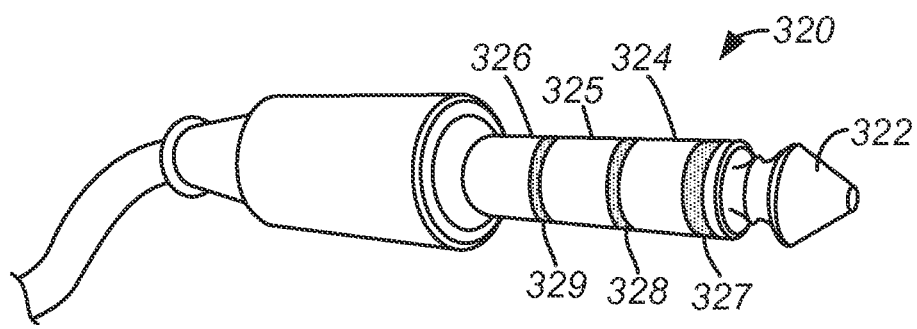

FIGS. 3A and 3B illustrate examples of audio plugs 310 and 320 having three and four conductive portions, respectfully. As shown in FIG. 3A, plug 310 includes a conductive tip 312, a conductive sleeve 316 and a conductive ring 314 electrically isolated from the tip 312 and the sleeve 316 by insulating rings 317 and 318. The three conductive portions 312, 314, 316 are for left and right audio channels and a ground connection, respectively. Plug 320, shown in FIG. 3B, includes four conductive portions: a conductive tip 322, a conductive sleeve 326 and two conductive rings 324, 325 and is thus sometime referred to as a TRRS (tip, ring, ring, sleeve) connector. The four conductive portions 322, 324, 325 and 326 are electrically isolated by insulating rings 327, 328 and 329 and are typically used for left and right audio, ground and microphone signals, respectively.

When plugs 310 and 320 are 3.5 mm miniature connectors, the outer diameter of conductive sleeve 316, 326 and conductive rings 314, 324, 325 is 3.5 mm and the insertion length of the connector is 14 mm. For 2.5 mm subminiature connectors, the outer diameter of the conductive sleeve is 2.5 mm and the insertion length of the connector is 11 mm long. Such TRS and TRRS connectors are used in many commercially available MP3 players and smart phones as well as other electronic devices. Electronic devices such as MP3 players and smart phones are continuously being designed to be thinner and smaller and/or to include video displays with screens that are pushed out as close to the outer edge of the devices as possible. The diameter and length of current 3.5 mm and even 2.5 mm audio connectors are limiting factors in making such devices smaller and thinner and in allowing the displays to be larger for a given form factor.

The sizes of corresponding receptacle connectors or audio jacks for the standard audio plugs connectors described above are also limiting factors in making portable electronic devices smaller. An example of traditional audio jacks mounted within an enclosure of an electronic device is shown in the following figures.

III. Prior Art

Figure 4A:
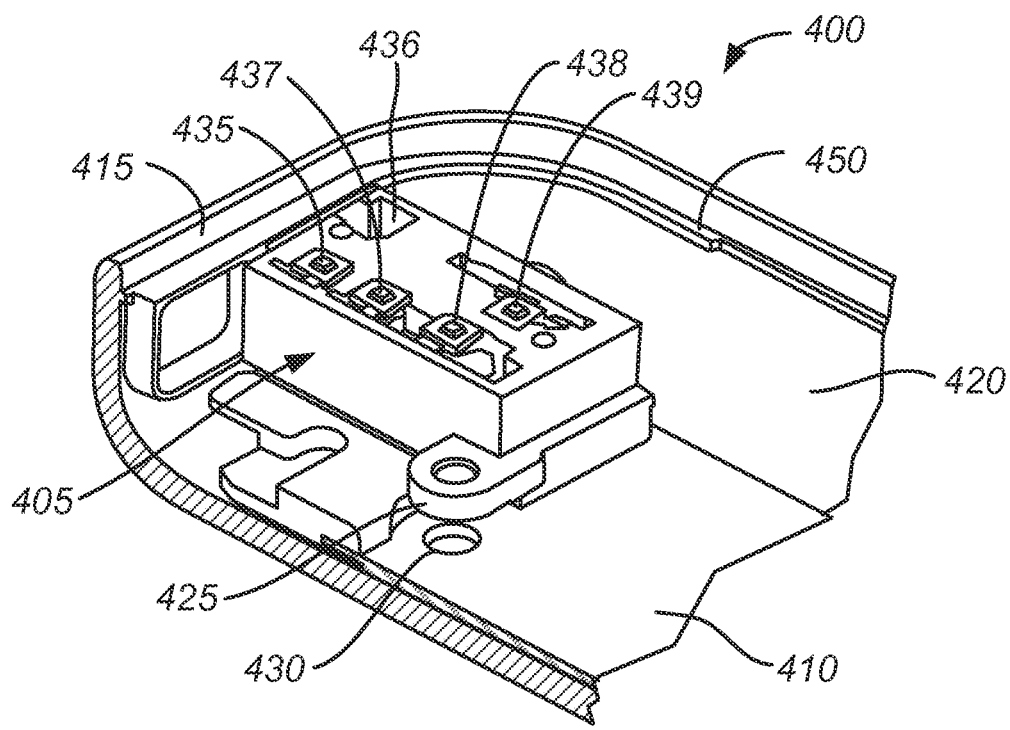
FIG. 4A illustrates a sectional perspective view of a traditional electronic device enclosure having an audio jack mounted thereon.

FIG. 4A illustrates a perspective view of a section of a traditional electronic device enclosure 400 having an audio jack 405 mounted thereon. Enclosure 400 includes a back portion 410 having bottom and left walls 415, 420 as well as top and right walls (not shown in FIG. 4A). Bottom wall 415 includes an opening (opening 465 shown in FIG. 4B) for access to audio jack 405.

Audio jack 405 is assembled on back portion 410, adjacent to an opening (opening 465 in FIG. 4B) on bottom wall 415. Audio jack 405 is mounted to back portion 410 via a screw (not shown in FIG. 4B) that is threaded through audio jack bracket 425 and threaded opening 430. Audio jack 405 also includes contacts 435-439 for mating with corresponding contacts on a standard audio plug.

Figure 4B:
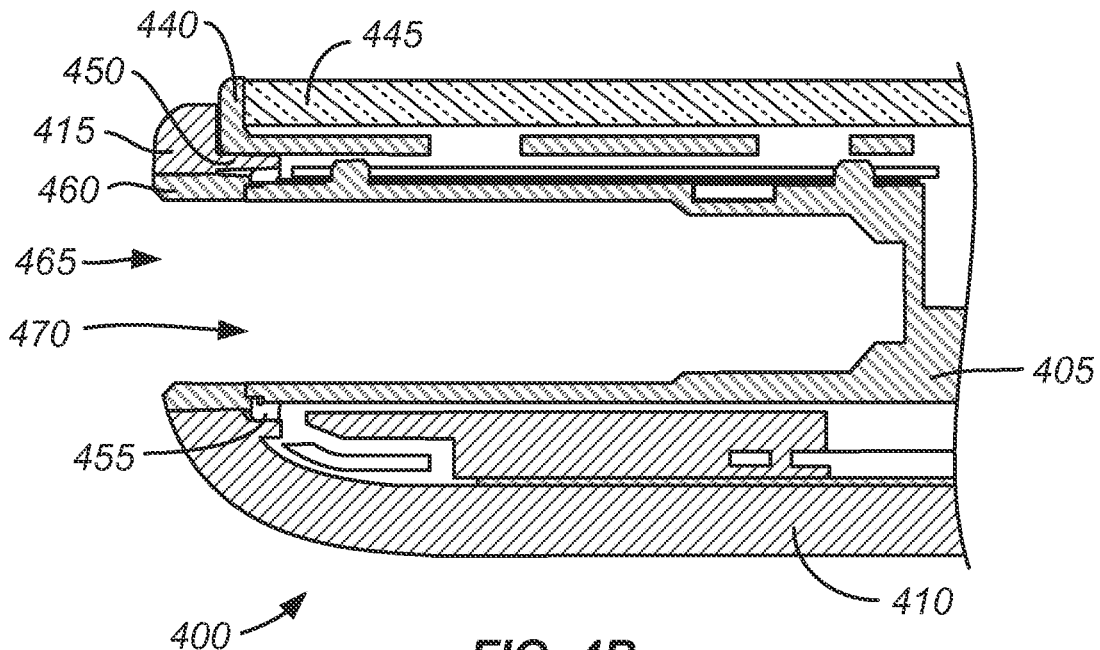
FIG. 4B illustrates a cross-sectional view of a section of a traditional enclosure having an audio jack mounted thereon and having a cover glass frame and a cover glass assembled therewith.

FIG. 4B illustrates a cross-sectional view of a section of traditional electronic device enclosure 400 having audio jack 405 mounted thereon and having a cover glass frame 440 and a cover glass 445 assembled therewith. Cover glass frame 440 and cover glass 445 are held in position by shelf 450 and other interlocking features (not shown in FIG. 4B). As shown in FIG. 4B, an opening 470 of audio jack 405 is registered with opening 465 of bottom wall 415. Trim gasket 455 surrounds opening 470 and is intended to seal gaps between enclosure 400 and audio jack 405 in order to limit liquid ingress. A trim 460 may be included that surrounds opening 465. A standard audio plug may be inserted through opening 465 and into opening 470 in order for its contacts to mate with corresponding contacts 435-439 (not shown in FIG. 4B) of audio jack 405.

Embodiments of unified bodies including an enclosure and a full or partial audio jack shell are discussed in the next section and potentially may require less internal space, parts, cost and manual assembly time than traditional embodiments described above.

IV. Full and Partial Unibody Designs

Enclosures may be integrally formed with a full or partial receptacle connector shell for receiving electrical connectors such as audio connectors or plugs. In this manner, the enclosure may form a unified body or unibody with a full or partial receptacle connector where the unibody is formed from a single piece of material. Examples of these unibodies formed from a single piece of polymer or metal are discussed below.

A. Full Unibody Design

Figure 5A:
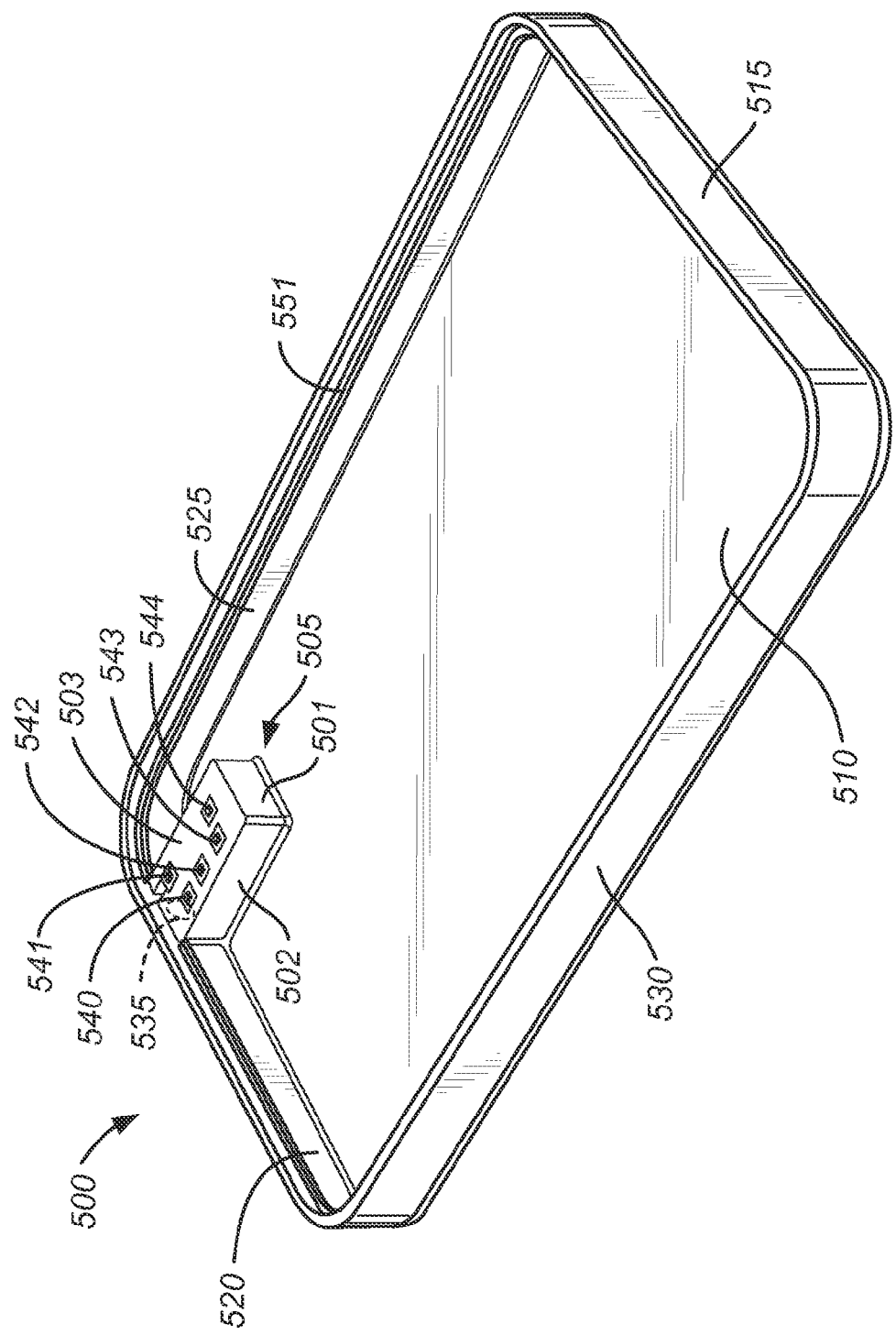
FIGS. 5A-B illustrate perspective and sectional perspective views, respectively, of an electronic device enclosure integrally formed with an audio jack shell.
Figure 5B:
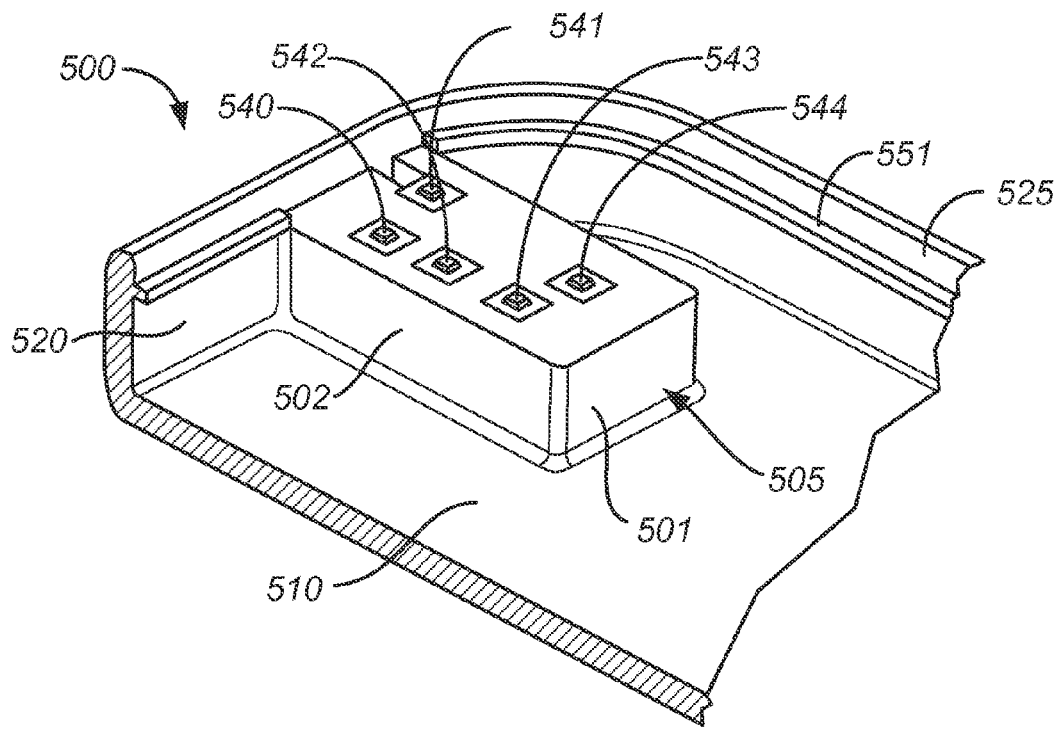

FIGS. 5A and 5B illustrate perspective and sectional perspective views, respectively, of an electronic device enclosure 500 integrally formed with an audio jack shell 505. Enclosure 500 includes a back portion 510 having top and bottom opposing walls 515, 520 and left and right opposing walls 525, 530. Bottom wall may include an opening 535 (only shown in FIG. 5A), for receiving plug connectors, e.g., standard audio plugs. Back portion 510 and bottom wall 520 may be integrally formed with audio jack shell 505 so as to form unibody enclosure 500 that is formed from a single piece of polymer or metal. Audio jack shell 505 includes a front portion 501, a right sidewall 502 and an opposing left side wall (not shown in FIGS. 5A-B), and a top wall 503. In some embodiments, contacts 540-544, for mating with corresponding contacts on a standard audio plug, may not be integrally formed with enclosure 500, but rather assembled separately.

This single piece enclosure 500 including audio jack shell 505 may be formed by injecting molten polymer, e.g., thermoplastics, or glass filled resin, e.g., glass reinforced nylon, into a mold, i.e., injection molding, so as to form a single piece of polymer. Alternatively, enclosure 500 may be formed by molding Liquidmetal or a metal injection molding process (MIM) to form a single piece of metal, e.g., stainless steel.

Figure 5C:
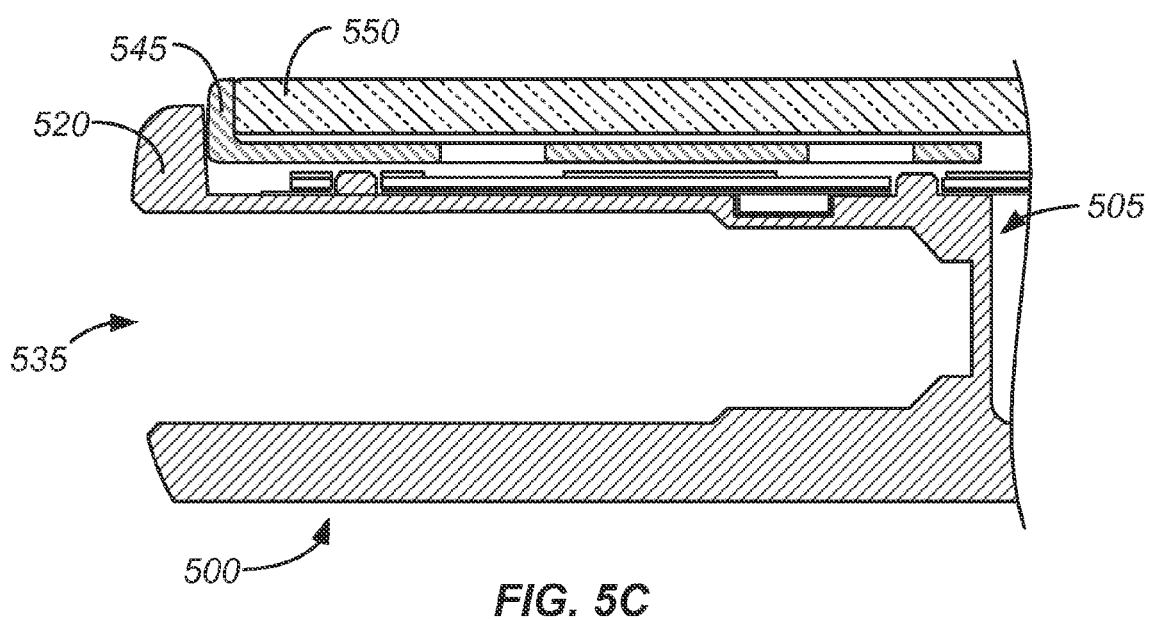
FIG. 5C illustrates a cross-sectional view of a section of a unibody enclosure integrally formed with audio jack shell and having a cover glass frame and a cover glass assembled therewith.

FIG. 5C illustrates a cross-sectional view of a section of unibody enclosure 500 integrally formed with audio jack shell 505 and having a cover glass frame 545 and a cover glass 550 assembled therewith. Cover glass frame 545 and cover glass 550 are supported by shelf 551 (shown in FIGS. 5A-B) and other interlocking features (not shown in FIG. 5C). As shown in FIG. 5C, opening 535 serves as the opening for enclosure 500 and audio jack 505 because these elements are formed from a single piece of material. Opening 535 may be configured to receive standard audio plugs. As compared to traditional enclosure 400 (as shown in FIGS. 4A-B and discussed above), the overall depth in which audio jack shell 505 extends towards top wall 515 may be reduced by not including a trim (e.g., trim 460 as shown in FIG. 4B) or a trim gasket (e.g., gasket 455 as shown in FIG. 4B). Not including a trim eliminates cosmetic gaps between an enclosure and the trim. However, the potential for liquid ingress at the interface of the enclosure 500 and the audio jack 505 is also eliminated by virtue of the elimination of the cosmetic gaps. Hence, trim gaskets may not be needed for enclosure 500 to fill gaps at seams between parts to prevent liquid ingress.

Although not shown in FIGS. 5A-5C, in some embodiments, enclosure 500 may also include one or more additional openings (in addition to opening 535) for providing access to more than one receptacle connector. For example, enclosure 500 may include openings for two receptacle connectors such as receptacle connectors 230 and 235 (as shown in FIG. 2).

Furthermore, one or more of the additional receptacle connectors may be integrated with embodiments of enclosure 500 in addition to or instead of audio jack 505.

B. Partial Unibody Design

Figure 6A:
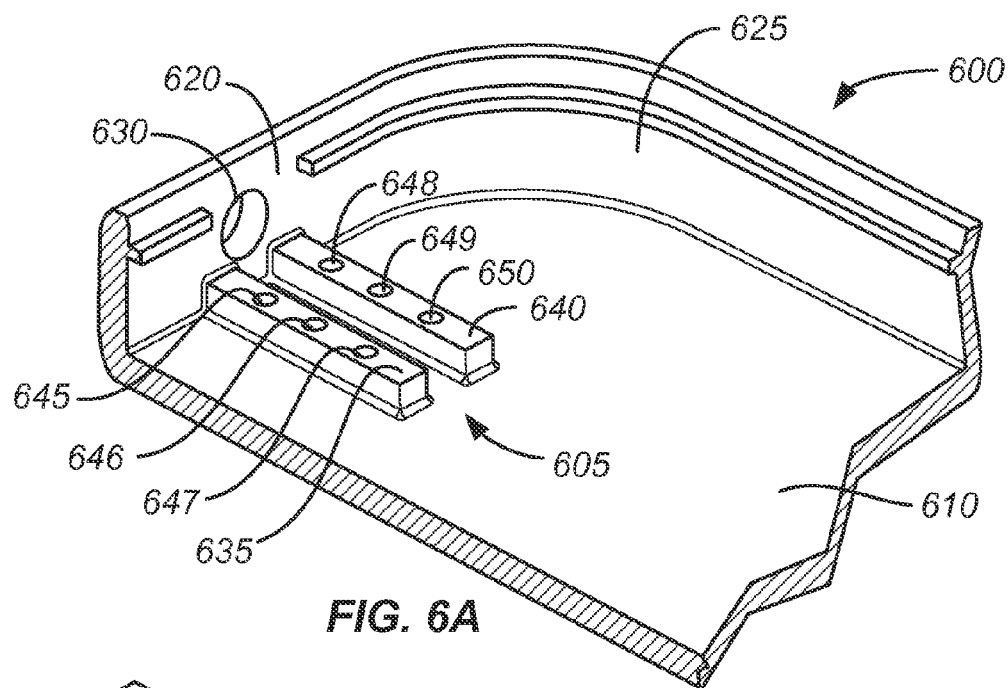
FIG. 6A illustrates a section of an electronic device enclosure integrally formed with a partial audio jack shell.

FIG. 6A illustrates a section of an electronic device enclosure 600 integrally formed with a partial audio jack shell 605. Enclosure 600 includes back portion 610 having a top wall (not shown in FIG. 6A) opposite a bottom wall 620 as well as left wall 625 opposite a right wall (not shown in FIG. 6A). Bottom wall 620 may include an opening 630 for receiving plug connectors, e.g., audio plugs. Back portion 610 and bottom wall 620 may be integrally formed with partial audio jack shell 605 so at to form a unibody enclosure 600 from a single piece of polymer or metal. Partial audio jack shell 605 may include first and second ridges 635, 640 having interlocking pockets 645-647 and 648-650, respectively. Interlocking pockets 645-650 may be used for interlocking with an overmolded part, as discussed below.

This single piece enclosure 600 including audio jack shell 605 may be formed by injecting molten polymer, e.g., thermoplastics, or glass filled resin, e.g., glass reinforced nylon, into a mold, i.e., injection molding, so as to form a single piece of polymer. Alternatively, enclosure 600 may be formed by molding Liquidmetal or a metal injection molding process (MIM) to form a single piece of metal, e.g., stainless steel. In other embodiments, single piece enclosure 600 may be formed by computer numerical control (CNC) of a machining tool.

In some embodiments, enclosure 600 may include more or fewer ridges, e.g., ridges 635 and 640, than shown in FIG. 6A. For example, enclosure 600 may include one ridge or three ridges. In other embodiments, other portions of an audio jack shell may be integrally formed with enclosure 600.

Figure 6B:
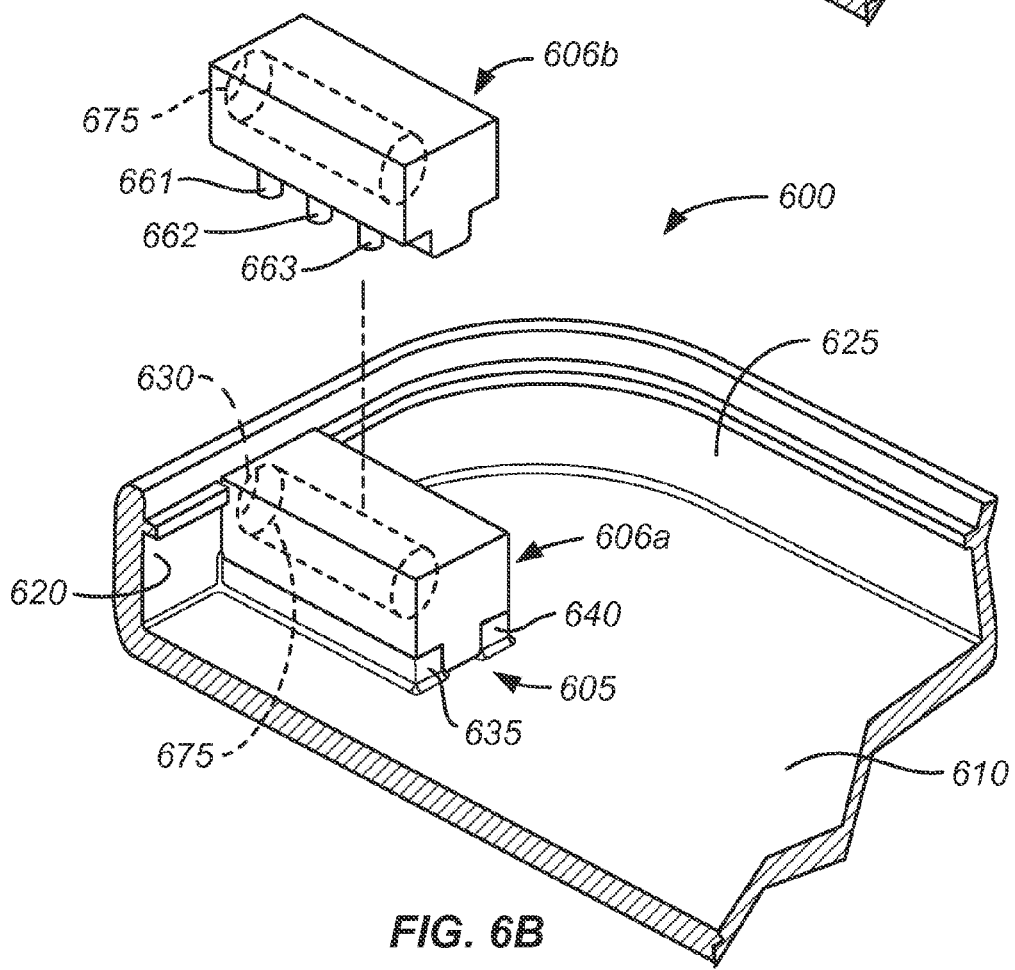
FIGS. 6B and 6C illustrate two perspective views of a section of an electronic device enclosure for an electronic device integrally formed with a first partial audio jack shell and overmolded with a second partial audio jack shell.
Figure 6C:
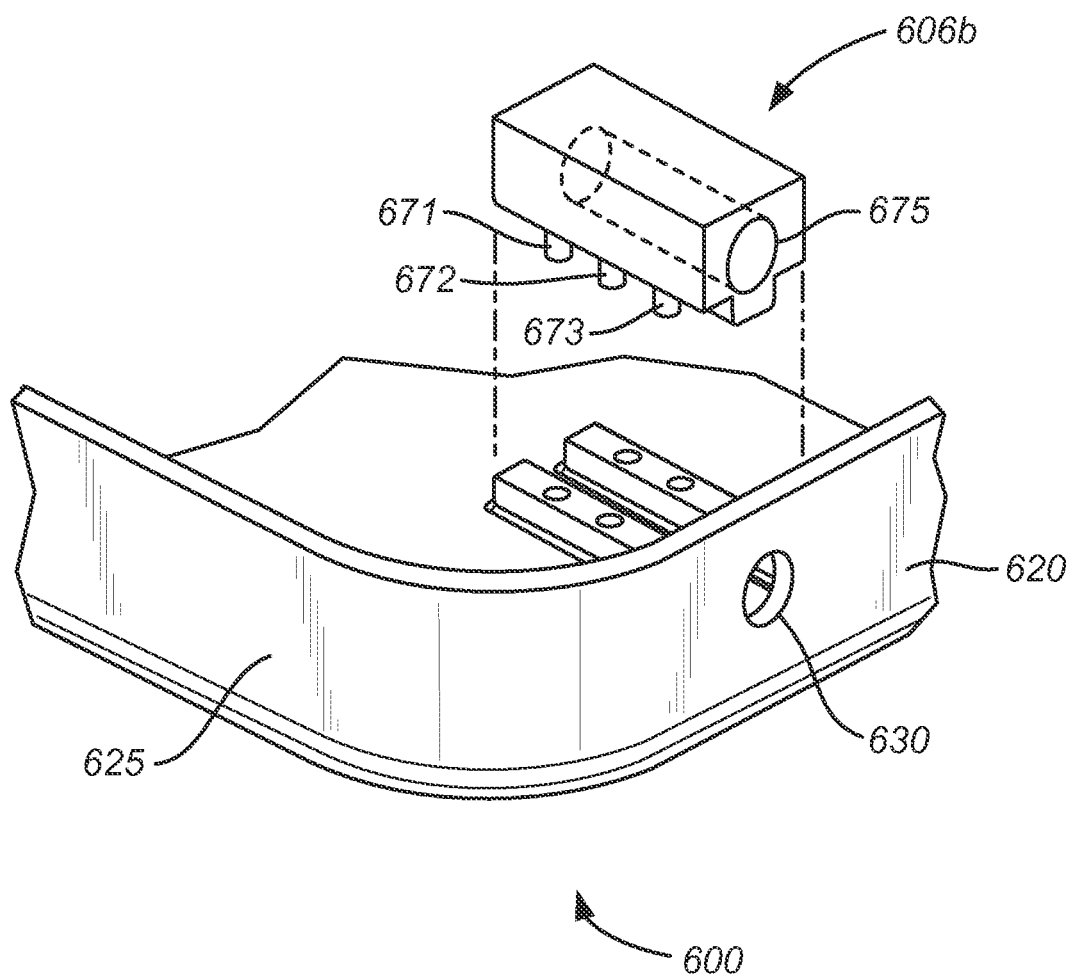

FIGS. 6B and 6C illustrate two perspective views of a section of an electronic device enclosure 600 for an electronic device integrally formed with a first partial audio jack shell 605 and overmolded with a second partial audio jack shell 606a. Second partial audio jack shell 606a may be formed over first partial audio jack shell 605 via overmolding molten polymer over bottom wall 620, back portion 610 and first partial audio jack shell 605 to form a full audio jack shell, as shown in FIG. 6B. Second partial audio jack shell 606b provides a view of what second partial audio jack shell 606a would look like if it was separated from enclosure 600 after the overmolding process. Second partial audio jack shell 606a includes interlocking pegs 661-663 (shown on second partial audio jack shell 606b) that correspond to pockets 645-647 (shown in FIG. 6A) for locking second partial audio jack shell 606a to first partial audio jack shell 605. Second partial audio jack shell 606a also includes additional interlocking pegs 671-673 (shown on second partial audio jack shell 606b) corresponding to interlocking pockets 648-650 (shown in FIG. 6A). Second partial audio jack shell 606a may be implemented in embodiments where enclosure 600 includes partial audio jack shell 605 and may be formed from a single piece of polymer or metal.

In some embodiments, first partial audio jack shell 605 and/or second partial audio jack shell 606a may include contacts (e.g., contacts 540-544 shown in FIG. 5B) for mating with corresponding contacts on a standard audio plug. The contacts may be integrally formed with enclosure 600 or may be assembled with first partial audio jack shell 605 and/or second partial audio jack shell 606a separately, as discussed below. As shown in FIG. 6B, an opening 675 of residual audio jack shell 606a is registered with opening 630 of bottom wall 620. A standard audio plug may be inserted through opening 630 and into opening 675 in order for its contacts to mate with corresponding contacts that may be implemented on first partial audio jack shell 605 and/or second partial audio jack shell 606a.

Gaps occurring at seams—interfacing surfaces between two discrete parts—between enclosure 600 and second partial audio jack shell 606a may be eliminated by virtue of the overmolding process which typically does not leave gaps at the seams. In this manner, liquid ingress may also be prevented in these embodiments as well. However, in some embodiments, second partial audio jack shell 606a may not be formed by overmolding, but rather by injection molding. Thereafter, the injection molded second partial audio jack shell 606a may be assembled, e.g., via press fitting, with enclosure 600. In these embodiments, assembling second partial audio jack shell 606a with enclosure 600 may result in seams with gaps; gaskets or sealants may be used at the gap locations to prevent liquid ingress.

In some embodiments, second partial audio jack shell 606a may be formed by a multiple-shot overmolding process wherein each overmolding process forms a different part of second partial audio jack shell 606a. Each overmolding process may use different types of polymers.

Embodiments of enclosure 600 may achieve similar benefits to that of enclosure 500 discussed above. In addition, enclosure 600 may be suitable with metal enclosures and/or allow for the use of more than one material implemented for an audio jack shell. For example, in some situations, it may be desirable to use glass filled resin for part of an audio jack for its structural properties and a cosmetic non-glass filled resin, e.g., polycarbonate, for parts of the audio jack exposed to the users of electronic devices.

Although not shown in FIGS. 6A-6C, in some embodiments, enclosure 600 may also include one or more additional openings (in addition to opening 630) for providing access to more than one receptacle connector. For example, enclosure 600 may include openings for two receptacle connectors such as receptacle connectors 230 and 235 (as shown in FIG. 2). Furthermore, one or more of the additional receptacle connectors may be integrated with embodiments of enclosure 600 in addition to or instead of audio jack 605.

C. Metal Trim

In some embodiments, it may be desirable to include a trim, as discussed with regards to the prior art, in the enclosure embodiments described above. The trim, which may be made from a metallic material, may be assembled with the enclosure and surround a receptacle connector opening of a bottom wall of an enclosure. Cosmetic gaps between the enclosure and the metal trim are removed by virtue of the insert molding process that may fill in potential gaps at the seams between the enclosure and the metal trim. It may be desirable for enclosures according to the present invention to include a metal trim in order to prevent wear caused by inserting and extracting plug connectors, e.g., TRS or TRRS audio plugs, into and from the opening of the enclosure,

D. Assembly of Contacts for Audio Jacks

Contacts implemented on enclosures of the present invention may be manually assembled using a press fit connection or insert molded in an overmolding process applied to a full or partial audio jack integrally formed with an enclosure. Similarly, contacts may be manually assembled using a press fit connection or insert molded in an overmolding process applied to a residual audio jack overmold.

V. Alternative Unibody Designs

Although embodiments disclosed herein relate to receptacle connector shells (e.g., audio jack shells) integrally formed with a back portion and bottom wall of an enclosure, enclosures according to the present invention may include receptacle connector shells integrally formed with any walls or portions of the enclosure. For example, a receptacle connector shell could be integrally formed with the back portion and the top wall. As another example, a receptacle connector shell could be integrally formed with the back portion and the top and left walls. As yet another example, the receptacle connector shell may not be integrally formed with a back portion of an enclosure, but rather with one or more two walls of the enclosure, e.g., bottom and right walls. The following figure illustrates an example of a unibody enclosure that does not include a back portion.

Figure 7:
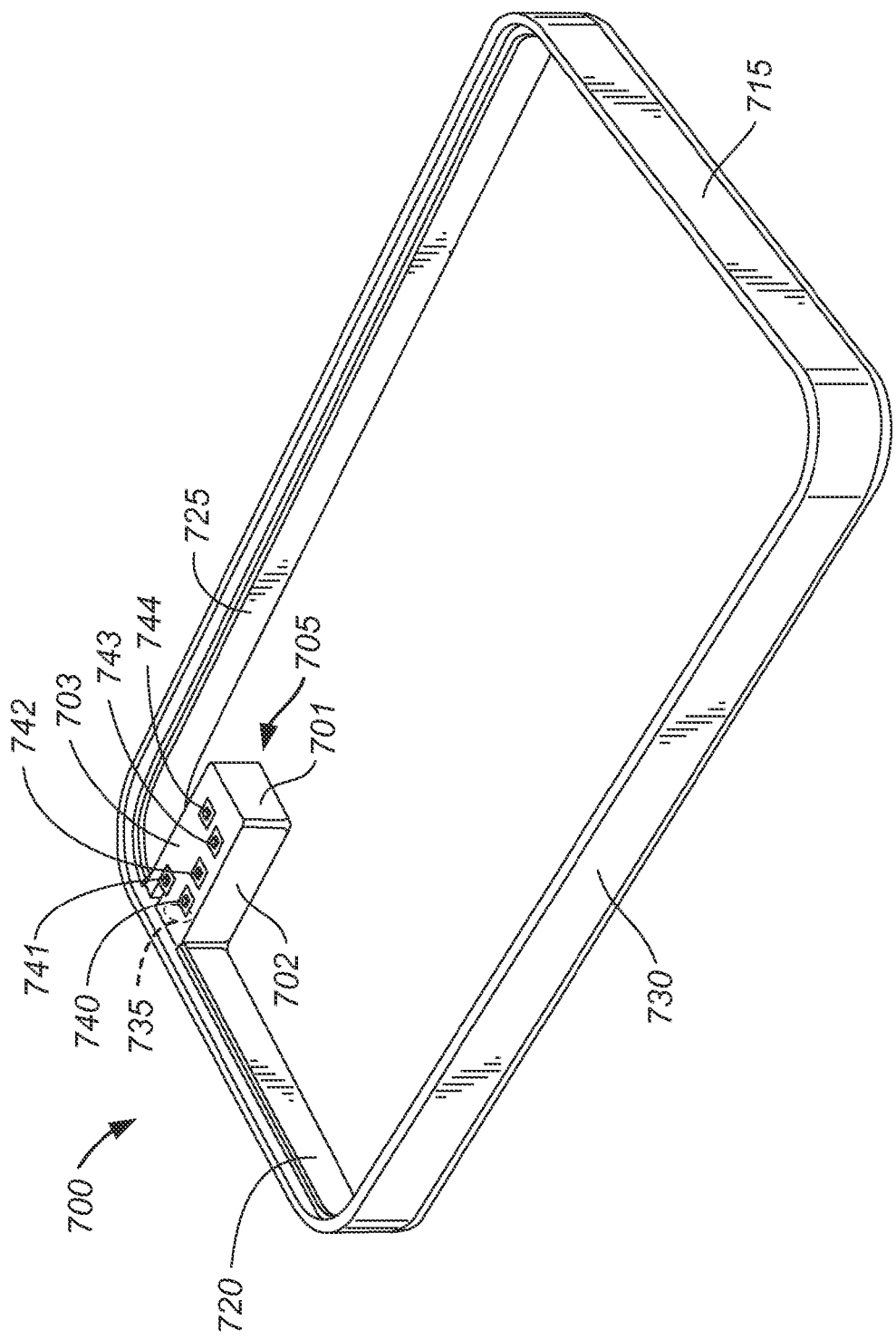
FIG. 7 illustrates a perspective view of an electronic device enclosure that does not include a back portion and is integrally formed with an audio jack shell.

FIG. 7 illustrates a perspective view of an electronic device enclosure 700 that does not include a back portion and is integrally formed with an audio jack shell 705. Enclosure 700 includes top and bottom opposing walls 715, 720 and left and right opposing walls 725, 730. Bottom wall may include an opening 735, for receiving plug connectors, e.g., standard audio plugs. Bottom wall 720 may be integrally formed with audio jack shell 705 so as to form unibody enclosure 700 that is formed from a single piece of polymer or metal. Audio jack shell 705 includes a front portion 701, a right sidewall 702 and an opposing left side wall (not shown in FIG. 7), and a top wall 703. In some embodiments, contacts 740-744 for mating with corresponding contacts on a standard audio plug may not be integrally formed with enclosure 700 but rather assembled separately.

As with other embodiments discussed herein, single piece enclosure 700, including audio jack shell 705, may be formed by injecting molten polymer, e.g., thermoplastics, or glass filled resin, e.g., glass reinforced nylon, into a mold, i.e., injection molding, so as to form a single piece of polymer. Alternatively, enclosure 700 may be formed by molding Liquidmetal or a metal injection molding process (MIM) to form a single piece of metal, e.g., stainless steel.

Although not shown in FIG. 7, in some embodiments, enclosure 700 may also include one or more additional openings (in addition to opening 735) for providing access to more than one receptacle connector. For example, enclosure 700 may include openings for two receptacle connectors such as receptacle connectors 230 and 235 (as shown in FIG. 2). Furthermore, one or more of the additional receptacle connectors may be integrated with embodiments of enclosure 700 in addition to or instead of audio jack 705.

Other components described herein may be integrally formed with an audio jack shell that is integrally formed with an enclosure, according to embodiments of the present invention. That is, components adjacent to audio jack shells could share one or more walls with the audio jack shell. Other components could also be formed integrally within the enclosure regardless of their proximity to the audio jack housing. For example, components could be integrated with walls of the enclosure or just the back portion of the enclosure.

Also, while a number of specific embodiments were disclosed with specific features, a person of skill in the art will recognize instances where the features of one embodiment can be combined with the features of another embodiment. For example, some specific embodiments of the invention set forth above were illustrated with audio jacks. A person of skill in the art will readily appreciate that any of the types of receptacle connectors described herein may be integrally formed with an enclosure, as well as other internal components specifically mentioned herein and not specifically mentioned herein. Also, those skilled in the art will recognize, or be able to ascertain using no more than routine experimentation, many equivalents to the specific embodiments of the inventions described herein. Such equivalents are intended to be encompassed by the following claims.

What is claimed is:

1. An electronic device enclosure, comprising: a back portion, the back portion having front and back surfaces; left and right opposing walls; top and bottom opposing walls, the bottom wall including an opening that communicates with a cavity extending longitudinally towards the top wall; and inner surfaces of a connector shell defining the cavity, the connector shell integrally formed with the back portion and the bottom wall, the connector shell defined at least in part by: a top connector wall extending from the bottom wall towards the top wall; first and second opposing sidewalls extending from the bottom wall towards the top wall; a front portion opposite the bottom wall extending between the first and second sidewalls; and a portion of the back portion of the electronic device enclosure, the portion extending between the first and second opposing sidewalls and extending between the bottom wall and the front portion; wherein the first and second sidewalls and the front portion also extend from the top wall to the back portion; and wherein the enclosure forms a unified body formed from a single piece of material.

2. The enclosure of claim 1, wherein the connector shell is configured to receive an audio plug inserted through the opening.

3. The enclosure of claim 1, wherein the material is metal.

4. The enclosure of claim 1, wherein the material is a polymer.

5. The enclosure of claim 1, wherein the connector shell includes contacts to form portions of electrical paths for mating with corresponding contacts on an electrical connector.

6. An electronic device enclosure, comprising:
a back portion having front and back surfaces;
left and right opposing walls emanating from the front surface; and
a bottom wall emanating from the front surface, the bottom wall including an opening;
wherein the front surface of the back portion includes first and second ridges integrally formed with the back portion and disposed adjacent to and on opposite sides of the opening and extending away from the bottom wall, the first and second ridges having a first depth and a plurality of pockets formed therein; and
a connector shell having a plurality of pegs corresponding to the plurality of pockets and overmolded on the first and second ridges;
wherein the enclosure forms a unified body with the connector shell.

7. The enclosure of claim 6, wherein the front surface of the back portion includes a third ridge extending between the first and the second ridges.

8. The enclosure of claim 6, wherein the enclosure is formed using an injection molding process.

9. The enclosure of claim 6, wherein the plurality of pockets are oriented in a first plane that is parallel to a plane in which the front surface of the back portion is oriented, the plurality of pockets having a second depth.

10. The enclosure of claim 9, wherein the connector shell is formed from a polymer and overmolded to the first and second ridges, a portion of a back surface of the bottom wall, and a portion of the front surface of the back portion so as to define a cavity of the opening.

11. The enclosure of claim 10, wherein the connector shell includes contacts to form portions of electrical paths for mating with corresponding contacts on an electrical connector.

12. The enclosure of claim 9, wherein the connector shell integrally formed with the first and second ridges so as to define a cavity of the opening.

13. The enclosure of claim 12, wherein the pegs are configured to be formed within the plurality of pockets.

14. The enclosure of claim 6, wherein the enclosure is made from a polymer.

* * * * *